(12) United States Patent
Gong et al.

(10) Patent No.: US 11,217,633 B2
(45) Date of Patent: Jan. 4, 2022

(54) OLED PANEL WITH REFLECTIVE LAYER AND MANUFACTURING METHOD THEREOF

(71) Applicant: Wuhan China Star Optoelectronics Semiconductor Display Technology Co., Ltd., Wuhan (CN)

(72) Inventors: Wenliang Gong, Wuhan (CN); Wenxu Xianyu, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 46 days.

(21) Appl. No.: 16/641,251

(22) PCT Filed: Aug. 5, 2019

(86) PCT No.: PCT/CN2019/099240
§ 371 (c)(1),
(2) Date: Feb. 24, 2020

(87) PCT Pub. No.: WO2020/228148
PCT Pub. Date: Nov. 19, 2020

(65) Prior Publication Data
US 2021/0151508 A1 May 20, 2021

(30) Foreign Application Priority Data
May 15, 2019 (CN) .......................... 201910406601.5

(51) Int. Cl.
*H01L 27/32* (2006.01)
*H01L 51/52* (2006.01)
*H01L 51/56* (2006.01)

(52) U.S. Cl.
CPC ........ *H01L 27/322* (2013.01); *H01L 27/3213* (2013.01); *H01L 27/3218* (2013.01); *H01L 51/5253* (2013.01); *H01L 51/5271* (2013.01); *H01L 51/56* (2013.01); *H01L 2251/558* (2013.01)

(58) Field of Classification Search
USPC .......................................................... 257/40
See application file for complete search history.

(56) References Cited

U.S. PATENT DOCUMENTS

2014/0125931 A1*  5/2014  Niu ................... G02F 1/133514
                                                         349/106
2015/0340412 A1   11/2015  Lee et al.
(Continued)

FOREIGN PATENT DOCUMENTS

CN    102707484    10/2012
CN    202548354    11/2012
(Continued)

*Primary Examiner* — Nduka E Ojeh

(57) ABSTRACT

An organic light-emitting diode (OLED) panel and a manufacturing method thereof are provided, wherein a color filter layer of the OLED panel includes a first color filter layer, a second color filter layer, a third color filter layer, and a reflective layer disposed between the first color filter layer, the second color filter layer, and the third color filter layer, wherein material of the reflective layer is same as material of the first color filter layer. Because the first color filter layer and the reflective layer are the same material, consumable cost of the mask is saved.

18 Claims, 2 Drawing Sheets

(56) References Cited

U.S. PATENT DOCUMENTS

| | | | |
|---|---|---|---|
| 2017/0153479 A1 | 6/2017 | Song | |
| 2018/0151628 A1* | 5/2018 | Park | H01L 27/3206 |
| 2019/0131321 A1* | 5/2019 | Yuan | H01L 27/1248 |
| 2019/0235311 A1* | 8/2019 | Lee | G02F 1/133516 |
| 2019/0280049 A1 | 9/2019 | Wang | |
| 2019/0353833 A1 | 11/2019 | Lin et al. | |
| 2020/0105855 A1* | 4/2020 | Lee | H01L 51/5221 |

FOREIGN PATENT DOCUMENTS

| | | |
|---|---|---|
| CN | 102854666 | 1/2013 |
| CN | 103268921 | 8/2013 |
| CN | 104965333 | 10/2015 |
| CN | 106940490 | 7/2017 |
| CN | 108963100 | 12/2018 |
| CN | 109065754 | 12/2018 |
| JP | 2013-222182 | 10/2013 |

\* cited by examiner

OLED PANEL WITH REFLECTIVE LAYER AND MANUFACTURING METHOD THEREOF

RELATED APPLICATIONS

This application is a National Phase of PCT Patent Application No. PCT/CN2019/099240 having International filing date of Aug. 5, 2019, which claims the benefit of priority of Chinese Patent Application No. 201910406601.5 filed on May 15, 2019. The contents of the above applications are all incorporated by reference as if fully set forth herein in their entirety.

FIELD AND BACKGROUND OF THE INVENTION

The present application relates to a field of display technologies, and in particular, to an organic light-emitting diode panel and manufacturing method thereof.

In order to reduce thickness of current organic light-emitting diode (OLED) display devices, functional components in the display devices need to be streamlined. Therefore, in current art, a color filter layer is used to replace a polarizer, and a black matrix of the color filter layer is used to realize reflection of external light.

As shown in FIG. 1, the OLED panel includes a color filter layer 11, an encapsulation layer 12, alight-emitting component 13, and a base substrate 14. The color filter layer 11 includes a red photoresist R, a green photoresist G, a blue photoresist B, and a black matrix BM, therefore, when the color filter layer is formed on the OLED panel, four photolithography processes are needed, so that the process is relatively complicated.

Accordingly, a color filter layer of current OLED panels has a technical problem of complicated processes.

SUMMARY OF THE INVENTION

The present application provides an organic light-emitting diode (OLED) panel and a manufacturing method thereof to alleviate the technical problems of the complicated process of a color filter layer of the conventional OLED panel.

To solve the above problems, the technical solution provided by the present application is as follows.

One embodiment of the present application provides an OLED panel, the OLED panel including:

a base substrate;

an OLED light-emitting component disposed on the base substrate, the OLED light-emitting component including a first light-emitting color sub-pixel, a second light-emitting color sub-pixel, and a third light-emitting color sub-pixel; and a color filter layer disposed on the OLED light-emitting component, wherein the color filter layer includes a first color filter layer disposed on the first light-emitting color sub-pixel, a second color filter layer disposed on the second light-emitting color sub-pixel, a third color filter layer disposed on the third light-emitting color sub-pixel, and a reflective layer disposed between the first color filter layer, the second color filter layer, and the third color filter layer, wherein material of the reflective layer is same as material of the first color filter layer.

In an OLED panel provided by one embodiment of the present application, material of the first color filter layer includes a blue photoresist.

In an OLED panel provided by one embodiment of the present application, a thickness of the reflective layer is greater than a thickness of the first color filter layer.

In an OLED panel provided by one embodiment of the present application, the OLED panel is further provided with an encapsulation layer for encapsulating the OLED light-emitting component, and the encapsulation layer is disposed between the OLED light-emitting component and the color filter layer.

In an OLED panel provided by one embodiment of the present application, a thickness of the color filter layer is less than 5 microns.

In an OLED panel provided by one embodiment of the present application, an illuminating color of the first light-emitting color sub-pixel is same as a color of the first color filter layer, an illuminating color of the second light-emitting color sub-pixel is same as a color of the second color filter layer, and an illuminating color of the third light-emitting color sub-pixel is same as a color of the third color filter layer.

In an OLED panel provided by one embodiment of the present application, further including a planarization layer disposed on the color filter layer.

In an OLED panel provided by one embodiment of the present application, the base substrate includes a glass substrate.

In an OLED panel provided by one embodiment of the present application, material of the buffer layer includes silicon oxide, or silicon nitride.

In an OLED panel provided by one embodiment of the present application, a thickness of the buffer layer is in a range of 5,000 angstroms to 10,000 angstroms.

In an OLED panel provided by one embodiment of the present application, each of the first light-emitting color sub-pixel, the second light-emitting color sub-pixel, and the third light-emitting color sub-pixel is one of a red light-emitting color sub-pixel, a green light-emitting color sub-pixel, and a blue light-emitting color sub-pixel.

In an OLED panel provided by one embodiment of the present application, further including a fourth light-emitting color sub-pixel, wherein the color filter layer includes a fourth color filter layer disposed on the fourth light-emitting color sub-pixel, and materials of the first color filter layer, the second color filter layer, the third color filter layer, and the fourth color filter layer are different.

One embodiment of the present application provides a manufacturing method of an OLED panel, the manufacturing method including:

providing a base substrate;

forming an OLED light-emitting component on the base substrate, the OLED light-emitting component including a first light-emitting color sub-pixel, a second light-emitting color sub-pixel, and a third light-emitting color sub-pixel;

forming a color filter layer on the OLED light-emitting component, the color filter layer including a first color filter layer disposed on the first light-emitting color sub-pixel, a second color filter layer disposed on the second light-emitting color sub-pixel, a third color filter layer disposed on the third light-emitting color sub-pixel, and a reflective layer disposed between the first color filter layer, the second color filter layer, and the third color filter layer, wherein material of the reflective layer is same as material of the first color filter layer.

In the manufacturing method of an OLED panel provided by one embodiment of the present application, the step of forming a color filter layer on the OLED light-emitting component includes: simultaneously forming the first color filter layer and the reflective layer using a blue photoresist in a photolithography process.

In the manufacturing method of an OLED panel provided by one embodiment of the present application, the step of forming a color filter layer on the OLED light-emitting component includes: simultaneously forming the first color filter layer and the reflective layer using a blue photoresist in a first photolithography process, forming the second color filter layer using a red photoresist in a second photolithography process, and forming the third color filter layer using a green photoresist in a third photolithography process.

In the manufacturing method of an OLED panel provided by one embodiment of the present application, the step of forming a color filter layer on the OLED light-emitting component includes: forming the second color filter layer using a red photoresist in a first photolithography process, simultaneously forming the first color filter layer and the reflective layer using a blue photoresist in a second photolithography process, and forming the third color filter layer using a green photoresist in a third photolithography process.

In the manufacturing method of an OLED panel provided by one embodiment of the present application, the step of forming a color filter layer on the OLED light-emitting component includes: forming the second color filter layer using a red photoresist in a first photolithography process, forming the third color filter layer using a green photoresist in a second photolithography process, and simultaneously forming the first color filter layer and the reflective layer using a blue photoresist in a third photolithography process.

In the manufacturing method of an OLED panel provided by one embodiment of the present application, the step of forming a color filter layer on the OLED light-emitting component includes: simultaneously forming the first color filter layer and the reflective layer using a semi-transmission mask in a photolithography process, wherein a thickness of the reflective layer is greater than a thickness of the first color filter layer.

In the manufacturing method of an OLED panel provided by one embodiment of the present application, the step of forming a color filter layer on the OLED light-emitting component includes: forming the second color filter layer using a red photoresist in a first photolithography process, forming the third color filter layer using a green photoresist in the second photolithography process, and simultaneously forming the first color filter layer and the reflective layer using a blue photoresist in the third photolithography process.

In the manufacturing method of an OLED panel provided by one embodiment of the present application, before forming a color filter layer on the OLED light-emitting component, the manufacturing method further includes: forming an encapsulation layer on the OLED light-emitting component for encapsulate the OLED light-emitting component, such that the step of forming a color filter layer on the OLED light-emitting component includes forming the color filter layer on the encapsulation layer.

The beneficial effects of this application are as follows. The present application provides an OLED panel and a manufacturing method of the OLED panel, which a first color filter layer of the OLED panel includes a first color filter layer disposed on the first light-emitting color sub-pixel, a second color filter layer disposed on the second light-emitting color sub-pixel, and a third color filter layer disposed on the third light-emitting color sub-pixel, and a reflective layer disposed between the first color filter layer, the second color filter layer, and the third color filter layer, wherein material of the reflective layer is same as material of the first color filter layer. In the present application, because the first color filter layer and the reflective layer are the same material, the first color filter layer and another layer can be simultaneously fabricated in the same photolithography process, thereby simplifying a photolithography process. The complicated technical problems of manufacturing process of the color filter layer of the conventional OLED panel are alleviated, the consumable cost of the mask is saved, and influence of the photolithography process on the OLED panel in a lithography process is also reduced.

BRIEF DESCRIPTION OF THE SEVERAL VIEWS OF THE DRAWINGS

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art can obtain the other drawings without any creative effort.

DESCRIPTION OF SPECIFIC EMBODIMENTS OF THE INVENTION

Figure 1:
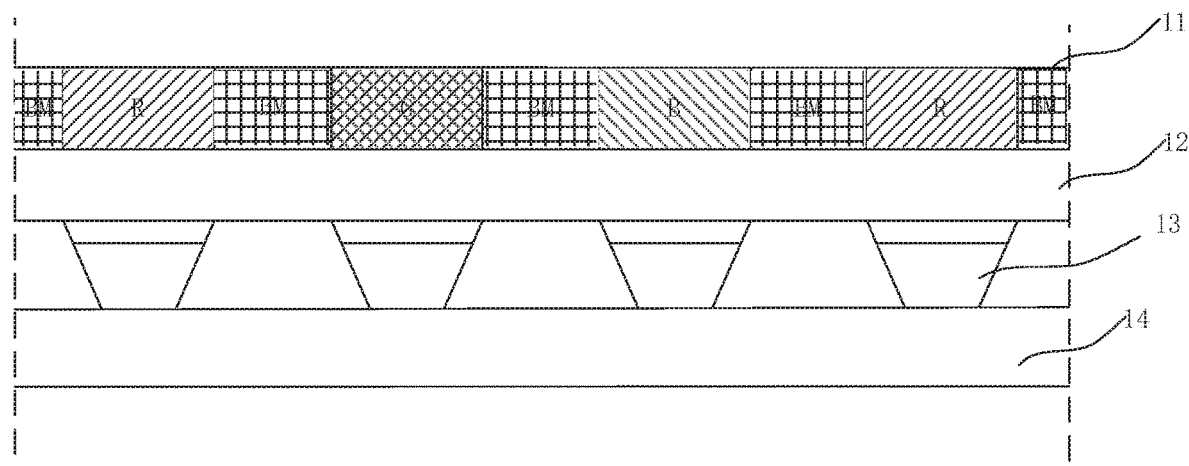
FIG. 1 is a schematic structural diagram of a conventional organic light-emitting diode (OLED) panel.

The following description of each embodiment, with reference to the accompanying drawings, is used to exemplify specific embodiments which can be carried out in the present invention. Directional terms mentioned in the present invention, such as "top", "bottom", "front", "back", "left", "right", "inside", "outside", "side", etc., are only used with reference to the orientation of the accompanying drawings. Therefore, the used directional terms are intended to illustrate, but not to limit, the present invention. In the drawings, components having similar structures are denoted by the same numerals.

The present invention can be alleviated in view of the technical problems of the complicated process of a color filter layer of the conventional organic light-emitting diode (OLED) panels.

Figure 2:
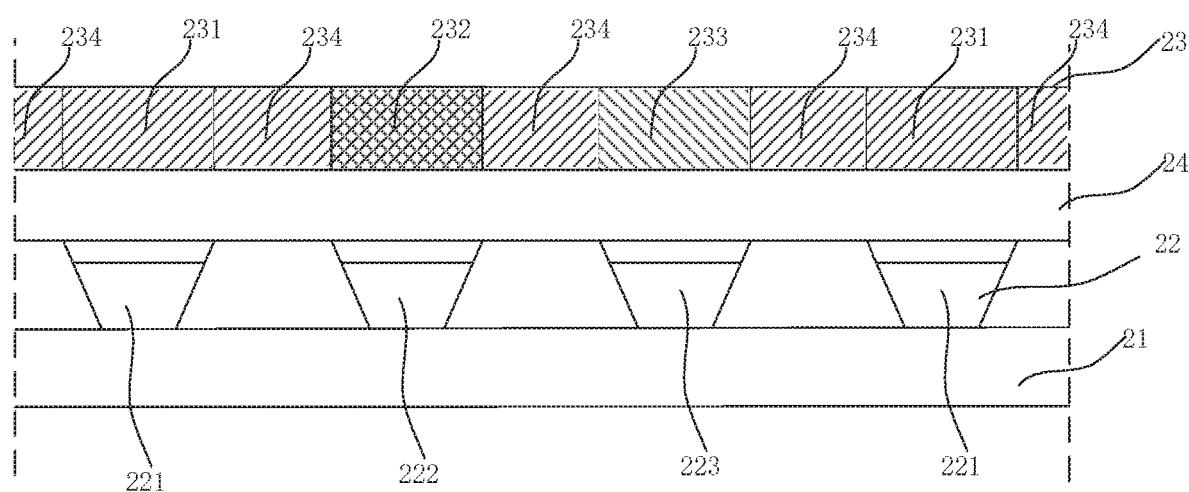
FIG. 2 is a schematic diagram of a first structure of an OLED panel according to one embodiment of the present application.
Figure 3:
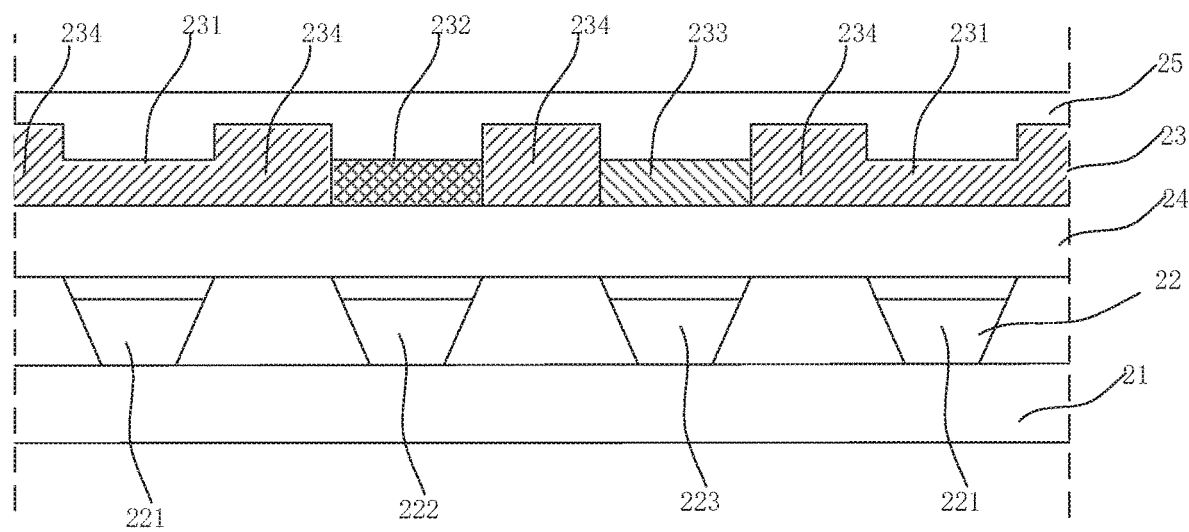
FIG. 3 is a schematic diagram of a second structure of the OLED panel according to one embodiment of the present application.

In one embodiment, as shown in FIG. 2 and FIG. 3, an OLED panel provided by the embodiment of the present application includes:

a base substrate 21 including a substrate, and a driving circuit disposed on the substrate;

an OLED light-emitting component 22 disposed on the base substrate 21, the OLED light-emitting component 22 including a first light-emitting color sub-pixel 221, a second light-emitting color sub-pixel 222, and a third light-emitting color sub-pixel 223; and a color filter layer 23 disposed on the OLED light-emitting component 22;

wherein the color filter layer 23 includes a first color filter layer 231 disposed on the first light-emitting color sub-pixel 221, a second color filter layer 232 disposed on the second light-emitting color sub-pixel 222, and a third color filter layer 233 disposed on the third light-emitting color sub-pixel 223, and a reflective layer 234 disposed between the first color filter layer 231, the second color filter layer 232, and the third color filter layer 233, wherein material of the reflective layer is same as material of the first color filter layer.

In the present embodiment, the light reflectance of material of the first color filter layer 231 satisfies a predetermined requirement, the visual requirements of the human eye can be satisfied, for example, the light reflectance of material of the first color filter layer 231 to external light is less than 5%.

The present embodiment provides an OLED panel, a color filter layer of the OLED panel includes a first color filter layer disposed on the first light-emitting color sub-pixel, a second color filter layer disposed on the second light-emitting color sub-pixel, a third color filter layer disposed on the third light-emitting color sub-pixel, and a reflective layer disposed between the first color filter layer, the second color filter layer, and the third color filter layer, wherein material of the reflective layer is same as material of the first color filter layer. In this application, because the first color filter layer and the reflective layer are the same material, the first color filter layer and another layer can be simultaneously fabricated in the same photolithography process, thereby simplifying a photolithography process. The complicated technical problems of manufacturing process of the color filter layer of the conventional OLED panel are alleviated, the consumable cost of the mask is saved, and influence of the photolithography process on the OLED panel in a lithography process is also reduced.

In one embodiment, the OLED panel includes three kinds of red, green, and blue light-emitting color sub-pixels, and each of the first light-emitting color sub-pixel 221, the second light-emitting color sub-pixel 222, and the third light-emitting color sub-pixel 223 is one of a red light-emitting color sub-pixel, a green light-emitting color sub-pixel, and a blue light-emitting color sub-pixel.

In one embodiment, an OLED panel includes four kinds of red, green, blue, and white light-emitting color sub-pixels, and each of the first light-emitting color sub-pixel 221, the second light-emitting color sub-pixel 222, and the third light-emitting color sub-pixel 223 is one of a red light-emitting color sub-pixel, a green light-emitting color sub-pixel, and a blue light-emitting color sub-pixel. In this case, the OLED panel further includes a fourth light-emitting color sub-pixel, the color filter layer includes a fourth color filter layer 23 provided on the fourth light-emitting color sub-pixel, and materials of the first color filter layer, the second color filter layer, the third color filter layer, and the fourth color filter layer are different.

In one embodiment, all sub-pixels of the OLED light-emitting component 22 emit same color and are converted by the color filter layer 23 to obtain various light-emitting colors of sub-pixels of the OLED panel. For example, all sub-pixels of the OLED light-emitting components 22 emit white light and are converted by the first color filter layer (made of blue photoresist), the second color filter layer (made of red photoresist), and the third color filter layer (made of green photoresist) of the color filter layer to obtain three kinds of light-emitting color sub-pixels.

In one embodiment, material of the first color filter layer 231 includes a blue photoresist. Because the main emission peak of the external light reflected by the blue photoresist is in a low sensitive area of the human visual function, the blue photoresist has a low reflectivity and meets predetermined requirements to meet the visual requirements of the human eye. In this embodiment, the first color filter layer is fabricated by blue photoresist, which reduces the material cost.

In one embodiment, as shown in FIG. 3, a thickness of a reflective layer 234 is greater than a thickness of the first color filter layer. This embodiment increases the thickness of the reflective layer, and further reduces reflectivity of the OLED panel in a light-shielding area.

In one embodiment, as shown in FIG. 3, the OLED panel further includes a planarization layer 25 disposed on the color filter layer 23 to achieve planarization of a surface of the OLED panel.

In one embodiment, a thickness of the color filter layer 23 is less than 5 microns.

In one embodiment, as shown in FIG. 2, the OLED panel is further provided with an encapsulation layer 24 for encapsulating the OLED light-emitting component, and the encapsulation layer 24 is disposed between the OLED light-emitting component 22 and the color filter layer 23.

In one embodiment, the OLED panel is a bottom emission white OLED panel, and the color filter layer is disposed between the base substrate and an OLED light-emitting layer.

The bottom emission white OLED panel is further described as follows.

In one embodiment, a bottom emission white OLED panel provided by one embodiment of the present application includes a first light-emitting color sub-pixel, a second light-emitting color sub-pixel, and a third light-emitting color sub-pixel, which specifically includes:

a base substrate;

a color filter layer disposed on the base substrate, wherein the color filter layer includes a first light-transmitting area corresponding to a light-emitting area of the first light-emitting color sub-pixel, a second light-transmitting area corresponding to a light-emitting area of the second light-emitting color sub-pixel, a third light-transmitting area corresponding to the third light-emitting color sub-pixel, and a light-shielding area; wherein the light-shielding area is disposed between the first light-transmitting area, the second light-transmitting area, and the third light-transmitting area; wherein materials of a first color filter layer disposed on the first light-transmitting area, a second color filter layer disposed on the second light-transmitting area, and a third color filter layer disposed on the third light-transmitting area are different; wherein materials of the first color filter layer and a fourth color filter layer disposed on the light-shielding area are same, and light reflectivity of material of the first color filter layer meets a predetermined requirement;

a buffer layer disposed on the color filter layer;

a semiconductor channel disposed on the buffer layer and a conductor layer connected to both sides of the semiconductor channel;

a gate insulating layer disposed on the semiconductor channel;

a gate disposed on the gate insulating layer;

an interlayer insulating layer disposed on the gate, the conductor layer, and the buffer layer, wherein the interlayer insulating layer includes a source contact hole, a drain contact hole, and a pixel definition hole passing the interlayer insulating layer to expose portions of a surface of the conductor layer, respectively, the source contact hole and the drain contact hole are respectively disposed at two sides of the gate and the gate insulating layer, and the pixel definition hole is disposed adjacent to the source contact hole;

a source S and a drain D disposed on the interlayer insulating layer, wherein the source S contacts the conductor layer through the source contact hole and the drain D contacts the conductor layer through the drain contact hole;

a passivation layer disposed on the source S, the drain D, and the interlayer insulating layer, wherein the passivation layer includes a hole exposing the pixel definition hole;

a white OLED light-emitting layer disposed in the pixel definition hole and having the conductor layer as an anode;

and a metal cathode disposed on the white OLED light-emitting layer and the passivation layer.

The source S, the drain D, the gate, the gate insulating layer, a portion of the conductor layer in contact with the source S, a portion of the conductor layer in contact with the drain D, and the semiconductor channel constitute a thin film transistor T. The semiconductor channel and the conductor layer respectively connected to both sides of the semiconductor channel are obtained by plasma processing of an entire surface of an oxide semiconductor layer, wherein a portion of the oxide semiconductor layer that is not blocked by the gate and the gate insulating layer is reduced in resistance to form the conductor layer, and a portion of the oxide semiconductor layer blocked by the gate and the gate insulating layer is still a semiconductor, forming the semiconductor channel region.

In the bottom emission white OLED panel of this embodiment, the thin film transistor T and the color filter layer are disposed on same base substrate, and the white light emitted by the white OLED light-emitting layer is filtered by the color filter layer to perform color display without setting a polarizer, therefore, the manufacturing cost is related lower. The conductor layer disposed in the same layer as the semiconductor channel is used as the anode of the white OLED, and it is not necessary to separately provide a separate anode. In addition, the arrangement of the light-shielding layer, the planarization layer, and the pixel definition layer is omitted, and the pixel area is defined by the pixel definition hole in the interlayer insulating layer, which not only simplifies the structure, but also further reduces the manufacturing cost.

In one embodiment, the base substrate is preferably a glass substrate.

In one embodiment, material of the buffer layer is silicon oxide or silicon nitride, and a thickness of the buffer layer is in a range of 5,000 angstroms to 10,000 angstroms (1 angstrom equals 0.1 nm).

In one embodiment, the raw material of the conductive layer and the semiconductor channel is one of indium gallium zinc oxide, indium zinc tin oxide, and gallium indium zinc tin oxide, and has a thickness of 400 angstroms to 1000 angstroms.

In one embodiment, material of the gate insulating layer is silicon oxide or silicon nitride and has a thickness of 1000 angstroms to 3000 angstroms.

In one embodiment, material of the gate is a laminated combination of one or more of molybdenum, aluminum, copper, and titanium, and has a thickness of 2000 angstroms to 8000 angstroms.

In one embodiment, material of the interlayer insulating layer is silicon oxide or silicon nitride and has a thickness of 2,000 angstroms to 10,000 angstroms.

In one embodiment, material of the source S and the drain D is a laminated combination of one or more of molybdenum, aluminum, copper, and titanium, and has a thickness of 2000 angstroms to 8000 angstroms.

In one embodiment, material of the passivation layer is silicon oxide or silicon nitride and has a thickness of 1,000 angstroms to 5,000 angstroms.

In one embodiment, the OLED panel is a top emission white OLED panel, and the color filter layer is disposed on an OLED light-emitting layer in a direction away from the base substrate. The top emission white OLED panel and the bottom emission white OLED panel are similar in structure, the difference is that the color filter layer is disposed on the OLED light-emitting layer in a direction away from the base substrate, and details are not described herein.

In one embodiment, the embodiment of the present application further provides a method for manufacturing an OLED panel, the manufacturing method includes the following steps:

Step 1, providing a base substrate;

Step 2, forming an OLED light-emitting component on the base substrate, the OLED light-emitting component including a first light-emitting color sub-pixel, a second light-emitting color sub-pixel, and a third light-emitting color sub-pixel;

Step 3, a color filter layer formed on the light-emitting component OLED, wherein the color filter layer includes a first color filter layer disposed on the first light-emitting color sub-pixel, a second color filter layer disposed on the second light-emitting color sub-pixel, a third color filter layer disposed on the third light-emitting color sub-pixel, and a reflective layer disposed between the first color filter layer, the second color filter layer, and the third color filter layer, wherein material of the reflective layer is same as material of the first color filter layer.

The present application provides a method of manufacturing an OLED panel, a color filter layer of the OLED panel obtained by the manufacturing method thereof includes a first color filter layer disposed on the first light-emitting color sub-pixel, a second color filter layer disposed on the second light-emitting color sub-pixel, a third color filter layer disposed on the third light-emitting color sub-pixel, and a reflective layer disposed between the first color filter layer, the second color filter layer, and the third color filter layer, wherein material of the reflective layer is same as material of the first color filter layer. In this application, because the first color filter layer and the reflective layer are the same material, the first color filter layer and another layer can be simultaneously fabricated in the same photolithography process, thereby simplifying a photolithography process. The complicated technical problems of manufacturing process of the color filter layer of the conventional OLED panel are alleviated, the consumable cost of the mask is saved, and influence of the photolithography process on the OLED panel in a lithography process is also reduced.

In one embodiment, the step of forming a color filter layer on the OLED light-emitting component includes: simultaneously forming a first color filter layer and a reflective layer using a blue photoresist in a photolithography process.

In one embodiment, the step of forming a color filter layer on the OLED light-emitting component includes: simultaneously forming a first color filter layer and a reflective layer using a blue photoresist in a first photolithography process, forming a second color filter layer using a red photoresist in a second photolithography process, and forming a third color filter layer using a green photoresist in a third photolithography process.

In one embodiment, the step of forming a color filter layer on the OLED light-emitting component includes: forming a second color filter layer using a red photoresist in a first photolithography process, simultaneously forming a first color filter layer and a reflective layer using a blue photoresist in a second photolithography process, and forming a third color filter layer using a green photoresist in a third photolithography process.

In one embodiment, the step of forming a color filter layer on the OLED light-emitting component includes: forming a second color filter layer using a red photoresist in a first photolithography process, forming a third color filter layer using a green photoresist in a second photolithography process, and simultaneously forming a first color filter layer and a reflective layer using a blue photoresist in a third photolithography process.

In one embodiment, the step of forming a color filter layer on the OLED light-emitting component includes: simultaneously forming a first color filter layer and a reflective layer using a semi-transmission mask in a photolithography process, wherein a thickness of the reflective layer is greater than a thickness of the first color filter layer.

In one embodiment, the step of forming a color filter layer on the OLED light-emitting component includes: forming a second color filter layer using a red photoresist in a first photolithography process, simultaneously forming a first color filter layer and a reflective layer using a blue photoresist and a semi-transmission mask in a second photolithography process, and forming a third color filter layer using a green photoresist in a third photolithography process.

In one embodiment, the step of forming a color filter layer on the OLED light-emitting component includes: simultaneously forming a first color layer and a reflective layer using a blue photoresist and a semi-transmission mask in a first photolithography process, forming a second color filter layer using a red photoresist in a second photolithography process, and forming a third color filter using a green photoresist in a third photolithography process.

In one embodiment, the step of forming a color filter layer on the OLED light-emitting component includes: forming a second color filter layer using a red photoresist in a first photolithography process, forming a third color filter layer using a green photoresist in a second photolithography process, and simultaneously forming a first color filter layer and a reflection layer using a blue photoresist and a semi-transmission mask in a third photolithography process.

In one embodiment, the semi-transmission mask is a gray scale mask or a halftone mask.

In one embodiment, the semi-transmission mask has an opaque area, a semi-transmission area, and residual a fully transparent area, wherein the opaque area is used to form the reflective layer, the semi-transmission area is used to form the first color filter layer, and the fully transparent area is used to form positions where the second color filter layer and the third color filter layer are disposed.

In one embodiment, before forming a color filter layer on the OLED light-emitting component, the manufacturing method of the OLED panel provided by the embodiment further includes: forming an encapsulation layer on the OLED light-emitting component for encapsulate the OLED light-emitting component, such that the step of forming a color filter layer on the OLED light-emitting component includes forming the color filter layer on the encapsulation layer.

In one embodiment, the OLED panel is a bottom emission white OLED panel. In this case, the OLED panel manufacturing method of the present embodiment forms the color filter layer on the substrate firstly, and then forms the OLED light-emitting layer on the color filter layer.

Now be further described for the manufacturing method of a bottom emission white OLED panel.

In one embodiment, the present application provides a method for manufacturing a bottom emission white OLED panel, including the steps described as follows.

Step 1, providing a base substrate and cleaning the base substrate, forming a color filter layer on the base substrate.

In one embodiment, the color filter layer includes a first light-transmitting area corresponding to alight-emitting area of the first light-emitting color sub-pixel, a second light-transmitting area corresponding to a light-emitting area of the second light-emitting color sub-pixel, a third light-transmitting area corresponding to the third light-emitting color sub-pixel, and a light-shielding area; wherein the light-shielding area is disposed between the first light-transmitting area, the second light-transmitting area, and the third light-transmitting area; wherein materials of a first color filter layer disposed on the first light-transmitting area, a second color filter layer disposed on the second light-transmitting area, and a third color filter layer disposed on the third light-transmitting area are different; wherein materials of the first color filter layer and a fourth color filter layer disposed on the light-shielding area are same, and light reflectivity of material of the first color filter layer meets a predetermined requirement.

In one embodiment, the base substrate is preferably a glass substrate.

Step 2, depositing a buffer layer on the color filter layer.

In one embodiment, in the step 2, material of the buffer layer is silicon oxide (SiOx), or silicon nitride (SiNx).

Step 3, depositing an oxide semiconductor film on the buffer layer and performing a patterning process to form an oxide semiconductor layer.

In one embodiment, in the step 3, material of the oxide semiconductor film can be one of indium gallium zinc oxide, indium zinc tin oxide, and indium gallium zinc tin oxide.

Step 4, sequentially depositing an insulating layer and a first metal layer on the oxide semiconductor layer and the buffer layer.

In one embodiment, in the step 4, material of the insulating layer is silicon oxide or silicon nitride, and material of the first metal layer is a laminated combination of one or more of molybdenum, aluminum, copper, and titanium.

Step 5, first patterning the first metal layer by a photolithography process and/or an etching process to form a gate, and then etching the insulating layer with the gate as a self-aligned pattern to form a gate insulating layer beneath the gate.

In one embodiment, the gate and gate insulating layer block a portion of the oxide semiconductor layer, exposing both sides of the oxide semiconductor layer.

Step 6, performing a plasma treatment on an entire surface of the oxide semiconductor layer such that a portion of the oxide semiconductor layer that is not blocked by the gate and the gate insulating layer is reduced in resistance to form a conductor layer, and a portion of the oxide semiconductor layer blocked by the gate and the gate insulating layer is still a semiconductor, forming the semiconductor channel region.

In one embodiment, the step 6 uses helium gas or argon gas to perform plasma treatment.

Step 7, depositing an interlayer insulating layer on the gate, the conductor layer, and the buffer layer, and patterning the interlayer insulating layer by a photolithography process and/or an etching process to form a source contact hole, a drain contact hole, and a pixel definition hole passing the interlayer insulating layer to expose portions of a surface of the conductor layer, respectively.

In one embodiment, the source contact hole and the drain contact hole are respectively disposed at two sides of the gate and the gate insulating layer, and the pixel definition hole is disposed adjacent to the source contact hole.

In one embodiment, in the step 7, material of the interlayer insulating layer is silicon oxide or silicon nitride.

Step 8, depositing a second metal layer on the interlayer insulating layer and patterning the second metal layer by a photolithography process and/or an etching process to form a source S and a drain D. The source S contacts the conductor layer through the source contact hole and the drain D contacts the conductor layer through the drain contact hole.

The source S, the drain D, the gate, the gate insulating layer, a portion of the conductor layer in contact with the source S, a portion of the conductor layer in contact with the drain D, and the semiconductor channel constitute a thin film transistor T.

In one embodiment, in the step 8, material of the second metal layer is a laminated combination of one or more of molybdenum, aluminum, copper, and titanium.

Step 9, depositing a passivation layer on the source S, the drain D, and the interlayer insulating layer, and patterning the passivation layer by a photolithography process and/or an etching process to form a hole exposing the pixel definition hole.

In one embodiment, in the step 9, material of the passivation layer is silicon oxide or silicon nitride.

Step 10, depositing a white OLED light-emitting layer in the pixel definition hole with the conductor layer as an anode.

Step 11, depositing a metal cathode on the white OLED emitting layer and the passivation layer by thermal evaporation or sputtering.

So far, the fabrication of the bottom emission white OLED panel has been completed.

In the manufacturing method of the bottom emission white OLED panel of the present application, on the one hand, the thin film transistor T and the color filter layer are formed on the same substrate, and the white light emitted by the white OLED light-emitting layer is filtered by the color filter layer to perform color display without setting a polarizer, therefore to reduce the manufacturing cost. On the other hand, after the gate and the gate insulating layer are formed on the oxide semiconductor layer, the oxide semiconductor layer is subjected to plasma treatment on the entire surface of the oxide semiconductor layer, and consequently a portion of the oxide semiconductor layer that is not blocked by the gate and the gate insulating layer is reduced in resistance to form the conductor layer and a portion of the oxide semiconductor layer blocked by the gate and the gate insulating layer is still a semiconductor, forming the semiconductor channel region, and by using the conductor layer as the anode of the white OLED, the photolithography process and the etching process for separately forming the anode can be omitted. In addition, the fabrication of the light-shielding layer, the planarization layer, and the pixel definition layer is omitted, and the pixel area is defined by the pixel definition hole in the interlayer insulating layer, which simplifies the process and reduces the number of four photolithography processes, thereby saving four masks further reduce manufacturing costs.

In the manufacturing method of the OLED panel of the present application, which the OLED panel is a top emission white OLED panel. In this case, the OLED light-emitting layer is formed on the base substrate first, and then the color filter layer is formed on the OLED light-emitting layer. The method for fabricating the top emission white OLED panel is similar to the method for manufacturing the bottom emission white OLED panel, the OLED light-emitting layer is formed on the base substrate first, and then the color filter layer is formed on the OLED light-emitting layer, and details are not described herein.

In the meantime, the present application provides a display device, which includes an OLED panel, and the OLED panel includes:

a base substrate;

an OLED light-emitting component disposed on the base substrate, the OLED light-emitting component including a first light-emitting color sub-pixel, a second light-emitting color sub-pixel, and a third light-emitting color sub-pixel;

a color filter layer on the OLED light-emitting component;

wherein the color filter layer includes a first color filter layer disposed on the first light-emitting color sub-pixel, a second color filter layer disposed on the second light-emitting color sub-pixel, a third color filter layer disposed on the third light-emitting color sub-pixel, and a reflective layer disposed between the first color filter layer, the second color filter layer, and the third color filter layer, wherein material of the reflective layer is same as material of the first color filter layer.

In one embodiment, in the display device provided in this embodiment, material of the first color filter layer includes a blue photoresist.

In one embodiment, in the display device provided in this embodiment, a thickness of the reflective layer is greater than a thickness of the first color filter layer.

In one embodiment, in the display device provided in this embodiment, the OLED panel is further provided with an encapsulation layer for encapsulating the OLED light-emitting component, and the encapsulation layer is disposed between the OLED light-emitting component and the color filter layer.

In one embodiment, in the display device provided in this embodiment, a thickness of the color filter layer is less than 5 microns.

In one embodiment, the display device provided in this embodiment, an illuminating color of the first light-emitting color sub-pixel is same as a color of the first color filter layer, an illuminating color of the second light-emitting color sub-pixel is same as a color of the second color filter layer, and an illuminating color of the third light-emitting color sub-pixel is same as a color of the third color filter layer.

According to the above embodiment, it can be known that:

An embodiment of the present application provides an OLED panel and a manufacturing method thereof, wherein a color filter layer of the OLED panel includes a first color filter layer disposed on the first light-emitting color sub-pixel, a second color filter layer disposed on the second light-emitting color sub-pixel, a third color filter layer disposed on the third light-emitting color sub-pixel, and a reflective layer disposed between the first color filter layer, the second color filter layer, and the third color filter layer, wherein material of the reflective layer is same as material of the first color filter layer. In this application, because the first color filter layer and the reflective layer are the same material, the first color filter layer and another layer can be simultaneously fabricated in the same photolithography process, thereby simplifying a photolithography process. The complicated technical problems of manufacturing process of the color filter layer of the conventional OLED panel are alleviated, the consumable cost of the mask is saved, and influence of the photolithography process on the OLED panel in a lithography process is also reduced.

Embodiments of the present invention have been described, but not intending to impose any unduly constraint to the appended claims. For a person skilled in the art, any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. An organic light-emitting diode (OLED) panel, comprising:
a base substrate;
an OLED light-emitting component disposed on the base substrate, the OLED light-emitting component comprising a first light-emitting color sub-pixel, a second light-emitting color sub-pixel, and a third light-emitting color sub-pixel; and
a color filter layer disposed on the OLED light-emitting component, wherein
the color filter layer comprises a first color filter layer disposed on the first light-emitting color sub-pixel, a second color filter layer disposed on the second light-emitting color sub-pixel, a third color filter layer disposed on the third light-emitting color sub-pixel, and a reflective layer disposed between the first color filter layer, the second color filter layer, and the third color filter layer, wherein material of the reflective layer is same as material of the first color filter layer, and wherein a thickness of the reflective layer is greater than a thickness of the first color filter layer.

2. The OLED panel according to claim 1, wherein material of the first color filter layer comprises a blue photoresist.

3. The OLED panel according to claim 1, wherein the OLED panel is further provided with an encapsulation layer for encapsulating the OLED light-emitting component, and the encapsulation layer is disposed between the OLED light-emitting component and the color filter layer.

4. The OLED panel according to claim 1, wherein a thickness of the color filter layer is less than 5 microns.

5. The OLED panel according to claim 1, wherein an illuminating color of the first light-emitting color sub-pixel is same as a color of the first color filter layer, an illuminating color of the second light-emitting color sub-pixel is same as a color of the second color filter layer, and an illuminating color of the third light-emitting color sub-pixel is same as a color of the third color filter layer.

6. The OLED panel according to claim 1, further comprising a planarization layer disposed on the color filter layer.

7. The OLED panel according to claim 1, wherein the base substrate comprises a glass substrate.

8. The OLED panel according to claim 1, further comprising a buffer layer disposed on the color filter layer, wherein material of the buffer layer comprises silicon oxide, or silicon nitride.

9. The OLED panel according to claim 8, wherein a thickness of the buffer layer is in a range of 5,000 angstroms to 10,000 angstroms.

10. The OLED panel according to claim 1, wherein each of the first light-emitting color sub-pixel, the second light-emitting color sub-pixel, and the third light-emitting color sub-pixel is one of a red light-emitting color sub-pixel, a green light-emitting color sub-pixel, and a blue light-emitting color sub-pixel.

11. The OLED panel according to claim 1, further comprising a fourth light-emitting color sub-pixel, wherein the color filter layer comprises a fourth color filter layer disposed on the fourth light-emitting color sub-pixel, and materials of the first color filter layer, the second color filter layer, the third color filter layer, and the fourth color filter layer are different.

12. A manufacturing method of an organic light-emitting diode (OLED) panel, comprising:
providing a base substrate;
forming an OLED light-emitting component on the base substrate, the OLED light-emitting component comprising a first light-emitting color sub-pixel, a second light-emitting color sub-pixel, and a third light-emitting color sub-pixel;
forming a color filter layer on the OLED light-emitting component, the color filter layer comprising a first color filter layer disposed on the first light-emitting color sub-pixel, a second color filter layer disposed on the second light-emitting color sub-pixel, a third color filter layer disposed on the third light-emitting color sub-pixel, and a reflective layer disposed between the first color filter layer, the second color filter layer, and the third color filter layer, wherein material of the reflective layer is same as material of the first color filter layer,
wherein the step of forming the color filter layer on the OLED light-emitting component comprises: simultaneously forming the first color filter layer and the reflective layer using a semi-transmission mask in a photolithography process, and wherein a thickness of the reflective layer is greater than a thickness of the first color filter layer.

13. The manufacturing method according to claim 12, wherein the step of forming a color filter layer on the OLED light-emitting component comprises: simultaneously forming the first color filter layer and the reflective layer using a blue photoresist in a photolithography process.

14. The manufacturing method according to claim 12, wherein the step of forming the color filter layer on the OLED light-emitting component comprises: simultaneously forming the first color filter layer and the reflective layer using a blue photoresist in a first photolithography process, forming the second color filter layer using a red photoresist in a second photolithography process, and forming the third color filter layer using a green photoresist in a third photolithography process.

15. The manufacturing method according to claim 12, wherein the step of forming the color filter layer on the OLED light-emitting component comprises: forming the second color filter layer using a red photoresist in a first photolithography process, simultaneously forming the first color filter layer and the reflective layer using a blue photoresist in a second photolithography process, and forming the third color filter layer using a green photoresist in a third photolithography process.

16. The manufacturing method according to claim 12, wherein the step of forming the color filter layer on the OLED light-emitting component comprises: forming the second color filter layer using a red photoresist in a first photolithography process, forming the third color filter layer using a green photoresist in a second photolithography process, and simultaneously forming the first color filter layer and the reflective layer using a blue photoresist in a third photolithography process.

17. The manufacturing method according to claim 12, wherein the step of forming the color filter layer on the OLED light-emitting component comprises: forming a second color filter layer using a red photoresist in a first photolithography process, forming a third color filter layer using a green photoresist in the second photolithography process, and simultaneously forming the first color filter layer and the reflective layer using a blue photoresist in the third photolithography process.

18. The manufacturing method according to claim 12, wherein before forming the color filter layer on the OLED light-emitting component, the manufacturing method further comprises:

forming an encapsulation layer on the OLED light-emitting component for encapsulate the OLED light-emitting component, such that the step of forming the color filter layer on the OLED light-emitting component comprises forming the color filter layer on the encapsulation layer.

\* \* \* \* \*